US007843188B2

(12) United States Patent
Harres

(10) Patent No.: US 7,843,188 B2
(45) Date of Patent: Nov. 30, 2010

(54) REMOTE SENSOR NETWORK POWERED INDUCTIVELY FROM DATA LINES

(75) Inventor: Daniel N. Harres, Belleville, IL (US)

(73) Assignee: The Boeing Company, Chicago, IL (US)

( * ) Notice: Subject to any disclaimer, the term of this patent is extended or adjusted under 35 U.S.C. 154(b) by 259 days.

(21) Appl. No.: 12/123,930

(22) Filed: May 20, 2008

(65) Prior Publication Data

US 2009/0289506 A1 Nov. 26, 2009

(51) Int. Cl.
*G01R 1/20* (2006.01)

(52) U.S. Cl. .................................................... 324/126

(58) Field of Classification Search ....................... None
See application file for complete search history.

(56) References Cited

U.S. PATENT DOCUMENTS 4,428,078 A 1/1984 Kuo
7,215,216 B2 * 5/2007 Harres ........................ 333/260
2009/0027061 A1 * 1/2009 Curt et al. .................... 324/539
2009/0271131 A1 * 10/2009 Ashton ........................ 702/57

FOREIGN PATENT DOCUMENTS

EP 0907087 7/2000
GB 2280577 A 2/1995

OTHER PUBLICATIONS

UK Search and Examination Report dated Aug. 28, 2009, pp. 1-5.

* cited by examiner

*Primary Examiner*—Jermele M Hollington
(74) *Attorney, Agent, or Firm*—Yee & Associates, P.C.; Kevin G. Fields

(57) ABSTRACT

A computer implemented method and apparatus for a sensor network. The sensor network comprises a set of cables, a set of sensor units, and a central processor unit. The set of cables is capable of conducting an electrical current. The set of sensor units is coupled to the set of cables without physical contact to a wire in the set of cables, wherein the set of sensor units is capable of being powered by the electrical current and transmitting data in the electrical current. The central processor unit is connected to the set of cables and is capable of receiving the data from the set of sensor units in the electrical current.

21 Claims, 5 Drawing Sheets

REMOTE SENSOR NETWORK POWERED INDUCTIVELY FROM DATA LINES

BACKGROUND INFORMATION

1. Field

The present disclosure relates generally to sensor networks and in particular to a method and apparatus for monitoring or configuring sensors in a sensor network.

2. Background

A sensor is a device that measures a physical quantity and converts this measurement into a signal that can be read by an observer or a device, such as a computer or monitoring unit. Various industries may monitor many different sensors. These sensors may employ systems that include sensors that detect, for example, temperature, pressure, force, humidity, gas flow, presence of chemicals, magnetism, light, and other suitable physical quantities.

For example, sensors may be attached to a satellite for testing the satellite within a test chamber. These tests may include vibration tests, pressure tests, and temperature tests. This type of testing may be performed for hours, days, weeks, or some other suitable period of time.

In another example, sensors may also be placed onto and into an aircraft for testing. For example, tests may be performed on the wings of an aircraft to identify aerodynamics and stress on those wings. These types of tests may include monitoring temperatures and pressures on the wings of the aircraft sitting on a runway and monitoring the change in these temperatures and pressures as the aircraft takes off and reaches a cruising altitude.

Sensors also may be used in other applications such as, for example, environmental testing. With this type of testing, sensors may be placed within various locations in which parameters, such as temperature and humidity, may be monitored for long periods of time. Many of these sensors may store data for periods of time, such as days, weeks, and months.

Currently used sensor networks may have large amounts of wires. Typically, one cable powers the sensor, while the other cable is used to receive data from the sensor. As a result, each sensor in a sensor network requires two wires. In some setups, a single cable may provide both the power and data. With this type of setup, both direct voltage and the higher-frequency data are summed together and sent on a single cable.

One solution to the complexity is to use wireless sensors. Wireless sensors, however, emit radio frequency signals. These types of signals may sometimes interfere with the testing that occurs. For example, testing involves detecting electromagnetic radiation where these types of signals may interfere with obtaining accurate results. Also, the radio frequency signals generated by these transmitters also may interfere with the operation of some devices of the test. In addition, the wireless sensors generally require batteries, which require frequent replacement and may not last through the test or other critical operation.

Therefore, it would be advantageous to have a method and apparatus to overcome the above described problems.

SUMMARY

The advantageous embodiments provide a computer implemented method and apparatus for a sensor network. The sensor network comprises a set of cables, a set of sensor units, and a central processor unit. The set of cables is capable of conducting an electrical current. The set of sensor units is coupled to the set of cables without physical contact to a wire in the set of cables, wherein the set of sensor units is capable of being powered by the electrical current and transmitting data in the electrical current. The central processor unit is connected to the set of cables and is capable of receiving the data from the set of sensor units in the electrical current.

In another advantageous embodiment, an apparatus comprises a set of cables and a set of sensor units. The set of cables is capable of conducting an electrical current. The set of sensor units is coupled to the set of cables without physical contact to a wire within the set of cables, wherein the set of sensor units is capable of being powered by the electrical current and transmitting data in the electrical current.

In yet another advantageous embodiment, a method manages a plurality of inductively coupled sensor units. Data is received on a cable from a plurality of sensor units that is inductively coupled to the cable, wherein the plurality of sensor units powered by current in the cable. The data is stored in a storage device.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

The different advantageous embodiments recognize that, often times, cables may be too long or two short when the test setups change. As a result, very long cables may be used to ensure that the lengths are never too short. The advantageous embodiments recognize that these types of applications, however, may result in measurement errors as a result of wire resistance from long lengths of cable.

Also, when shorter wires are to be used with different setups, new cables may be cut and/or formed to the needed length. The advantageous embodiments recognize that having to create new lengths of cables may be time consuming and expensive. Further, this type of expense and time increases if the configuration or location of sensors changes over the testing period or between tests. The different advantageous embodiments recognize these types of solutions may increase the amount of time and complexity needed to perform various tests.

Figure 1:
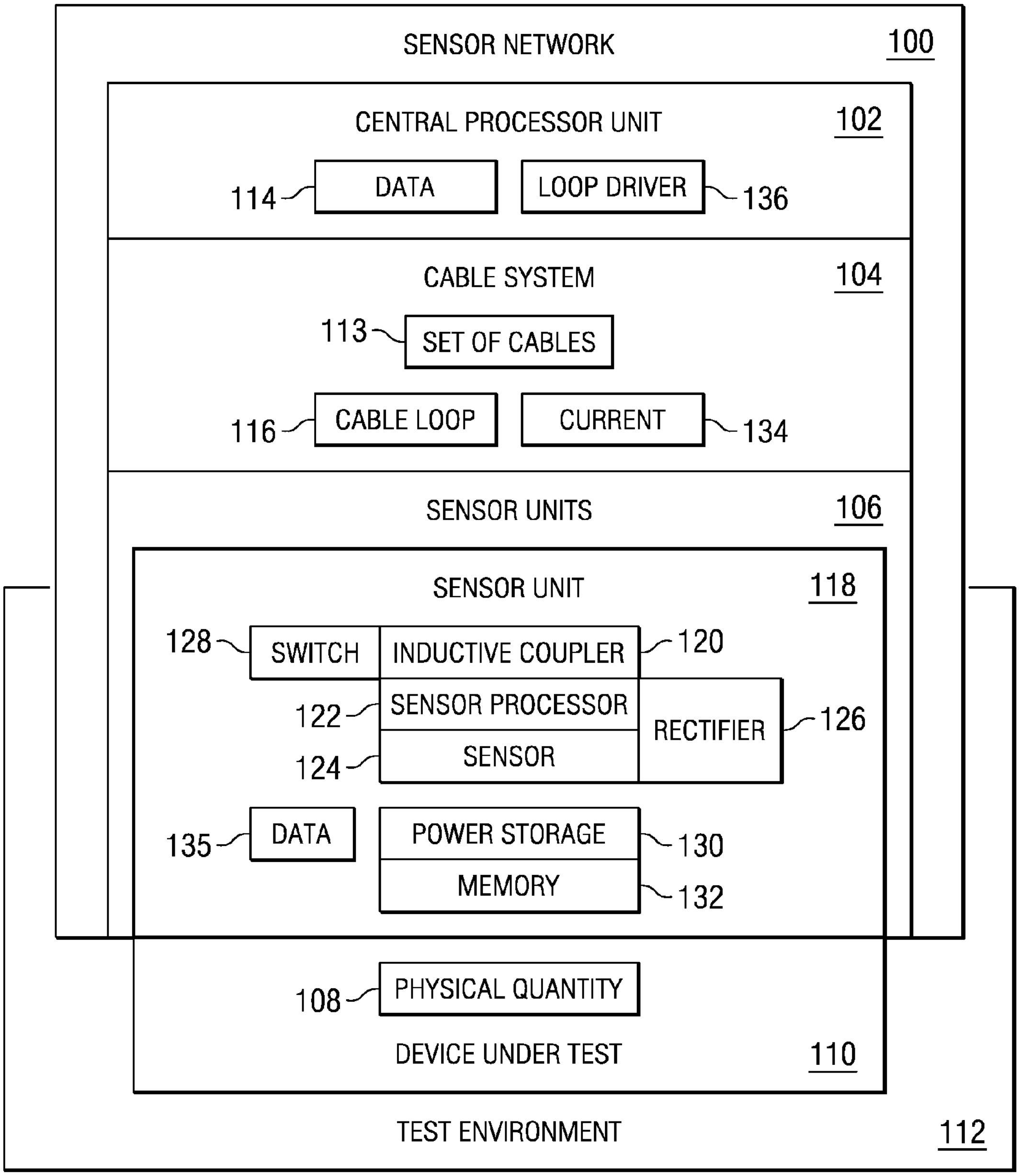
FIG. 1 is a diagram illustrating a sensor network in which an advantageous embodiment may be implemented.

With reference now to the figures and in particular with reference to FIG. 1, a diagram illustrating a sensor network is depicted in accordance with an advantageous embodiment. In this example, sensor network 100 included central processor unit 102, cable system 104, and sensor units 106. Sensor units 106 may detect physical quantity 108 for device under test 110 in test environment 112.

In these examples, central processor unit 102 may be any device that is capable of receiving and storing data 114. This data is received from sensor units 106 measuring physical quantity 108 of device under test 110 within test environment 112. Central processor unit 102 may be, for example, a computer, a controller, or some other suitable device.

In these examples, central processor unit 102 is coupled to sensor units 106 through cable system 104. Cable system 104 contains set of cables 113. A set, as used herein, refers to one or more items. For example, set of cables 113 within cable system 104 is one or more cables. In these examples, a cable comprises one or more wires that are bound in a protective jacket or sheath. Individual wires inside the jacket also may be covered or insulated. In these examples, cable system 104 also may take the form of cable loop 116, in which both ends of a cable within set of cables 113 are connected to central processor unit 102.

Sensor units 106 contain one or more sensor units, such as sensor unit 118. In this example, sensor unit 118 includes inductive coupler 120, sensor processor 122, sensor 124, rectifier 126, switch 128, power storage 130, and memory 132. Inductive coupler 120 provides a capability to attach sensor unit 118 to cable system 104. Inductive coupler 120 may be attached to a cable within set of cables 113 in cable system 104 in a manner to obtain power through current 134 which is applied by central processor unit 102 in these examples.

In the different advantageous embodiments, current 134 is an electrical current and may take the form of an alternating current. Also, inductive coupler 120 may be attached to set of cables 113 and may obtain power from current 134 without physical contact to a wire within set of cables 113. In these examples, current 134 is an alternating current.

Rectifier 126 may be used to change current 134 from an alternating current into a direct current for use by sensor processor 122. Sensor processor 122 may be any circuit or device that is capable of receiving data from sensor 124 and transmitting that data to central processor unit 102 for storage as data 114. Sensor processor 122 may be, for example, without limitation, a microprocessor, an advanced reduced instruction set computer machine processor (ARM), an application specific integrated circuit (ASIC), or some other suitable device.

In addition to receiving power through current 134, sensor processor 122 may receive data 135 from sensor 124 and send data 135 back to central processor unit 102 through current 134. Data 135 may be sent to central processor unit 102 by inducing changes in demand for current 134. In these examples, switch 128 shorts sensor unit 118 and increases the demand for current when switch 128 is closed. This short, caused by switch 128, may be detected as a logic 0, while an open state in switch 128 results in less demand and is detected as a logic 1. Of course, other mechanisms other than switch 128 may be used to change the current demand. For example, a voltage-to-current converter or other suitable device may be used.

Additionally, sensor units 106 also may include power storage 130. Power storage 130 may be, for example, a small battery that may be used to store power while switch 128 is closed and no power is provided to sensor unit 118. In other examples, a capacitor may be used to store power. Memory 132 may store data 135 until data 135 is transmitted to central processor unit 102. Sensor 124 may take various forms.

For example, without limitation, sensor 124 may be a thermometer, a thermistor, an ohm meter, an ammeter, a volt meter, a Hall effect device, an altimeter, a pressure sensor, a gas flow sensor, an oxygen sensor, a carbon monoxide sensor, a photocell, an infrared sensor, a microphone, a hydrophone, a motion sensor, or some other suitable device.

Further, sensor processor 122 also may receive information from central processor unit 102. This information may be, for example, data and/or commands. Sensor processor 122 may detect information being sent by central processor unit 102 by observing the phase of the sine wave that the central processor sends. For example, a 0° phase shift could indicate a logic 1 while a 180° phase shift could indicate a logic 0. Alternatively, and equivalently, a positive sine wave could indicate a logic 1 while a sine wave multiplied by −1 could indicate a logic 0.

In these examples, central processor unit 102 may use loop driver 136 to generate current 134 and detect changes in current 134. In this manner, loop driver 136 may receive data from sensor units 106 and send information to sensor units 106.

In this manner, sensor network 100 may be used to monitor physical quantities of device under test 110. In these examples, device under test 110 may take various forms. For example, device under test 110 may be, for example, an aircraft, a satellite, a car, a submarine, a tree, an area of land, a stretch of highway, or some other suitable object. Test environment 112 may be, for example, the environment in which device under test 110 is located.

For example, if device under test 110 is an aircraft, test environment 112 may be, for example, a runway and/or a location in the atmosphere while the aircraft is flying. If device under test 110 is a satellite, test environment 112 may be a test chamber in which various environments may be simulated for the satellite. In these examples, sensor units 106 may be placed in or on various locations for device under test 110.

The different advantageous embodiments may reduce the amount of wiring needed for sensor units 106 through inductive coupling of sensor units 106 to cable system 104. In this manner, one cable for power and another cable for data are unneeded. As a further advantage over currently used mechanisms, a single cable may be used to attach sensor units 106, rather than requiring multiple cables for each sensor unit. By using cable loop 116 from multiple sensor units within sensor units 106, the amount of cables needed in sensor network 100 may be reduced.

In addition, sensor units 106 may be placed or moved along different portions of cable system 104 without having to re-cut wires or cables. In this manner, the complexity and time needed to setup sensor units 106 to monitor device under test 110 may be reduced.

The illustration of sensor network 100 in FIG. 1 is not meant to imply architectural limitations to the manner in which sensor network 100 may be implemented. For example, cable system 104 may be implemented using a single cable rather than multiple cables. Further, if multiple cables or loops are used, then different numbers of sensor units 106 may be located on each cable. In addition, in some advantageous embodiments, more than one device under test may be present in test environment 112, instead of a single device under test. As additional examples, in some advantageous embodiments, sensor unit 118 may not include memory 132.

Figure 2:
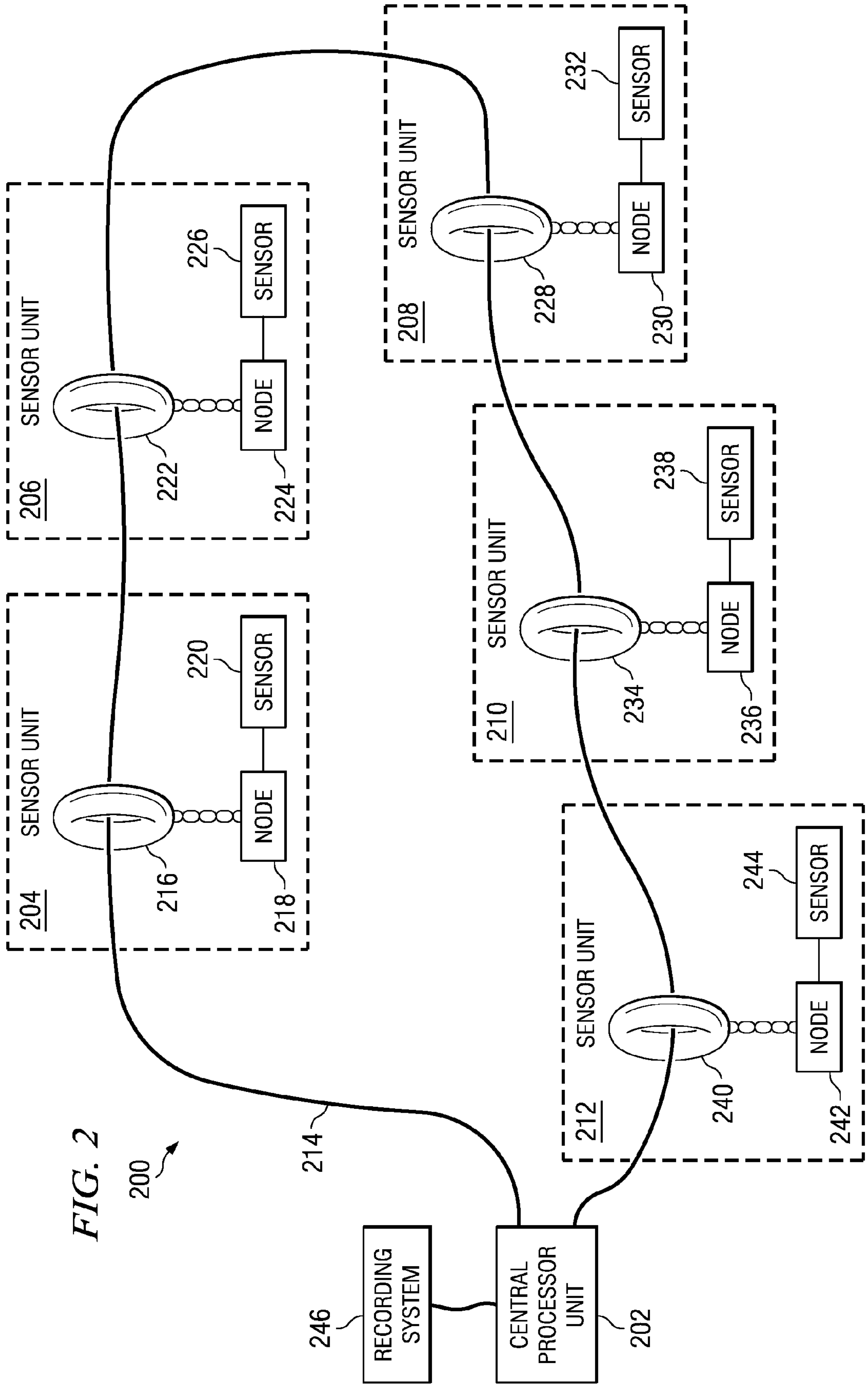
FIG. 2 is a diagram of a sensor network in accordance with an advantageous embodiment.

With reference now to FIG. 2, a diagram of a sensor network is depicted in accordance with an advantageous embodiment. In this example, sensor network 200 is an example of one implementation of sensor network 100 in FIG. 1. In this example, sensor network 200 includes central processor unit 202, sensor unit 204, sensor unit 206, sensor unit 208, sensor unit 210, sensor unit 212, and cable 214.

As depicted, sensor unit 204 includes inductive coupler 216, node 218, and sensor 220; and sensor unit 206 includes inductive coupler 222, node 224, and sensor 226. Sensor unit 208 includes inductive coupler 228, node 230, and sensor 232. Sensor unit 210 includes inductive coupler 234, node 236, and sensor 238. In a similar fashion, sensor unit 212 includes inductive coupler 240, node 242, and sensor 244.

In these illustrative examples, the different nodes illustrated contain a circuitry to obtain power from the inductive couplers. The different sensors illustrated in FIG. 2 are examples of sensor 124 in FIG. 1. Components within these nodes may include, for example, sensor processor 122, switch 128, rectifier 126, power storage 130, and memory 132 in sensor unit 118 in FIG. 1. Each node may be located in a separate enclosure from the inductive coupler and the sensor associated with that node.

In these examples, the different inductive couplers use split core transformers so that the inductive couplers can be opened and clamped to cable 214. This clamping occurs without physical contact with the wire within cable 214. Instead, the power may be provided inductively through the split core transformer. The split core transformer may be any currently available split core transformer design or system.

In this example, central processor unit 202 may be connected to recording system 246. This connection may be made through, for example, a universal serial bus cable, network cable, a wireless interface, or some other communications link. Of course, in other advantageous embodiments, central processor unit 202 also may include a mechanism for storing data.

In these examples, central processor unit 202 performs discovery when power up occurs for sensor network 200. Central processor unit 202 identifies each sensor unit present within sensor network 200. These operations may be lengthy, depending on the response mechanism for the different sensor units. In these examples, the self discovery may require an exchange of as many as 50,000 bits in a 16 node system. At a rate of 4800 bits per second, 50,000 bits may be exchanged within around ten seconds, in these examples. Of course, other rates may be used depending on the particular implementation.

After power up has occurred within sensor network 200, central processor unit 202 may receive data from the different sensors. Further, central processor unit 202 also may send information to these sensor units.

Figure 3:
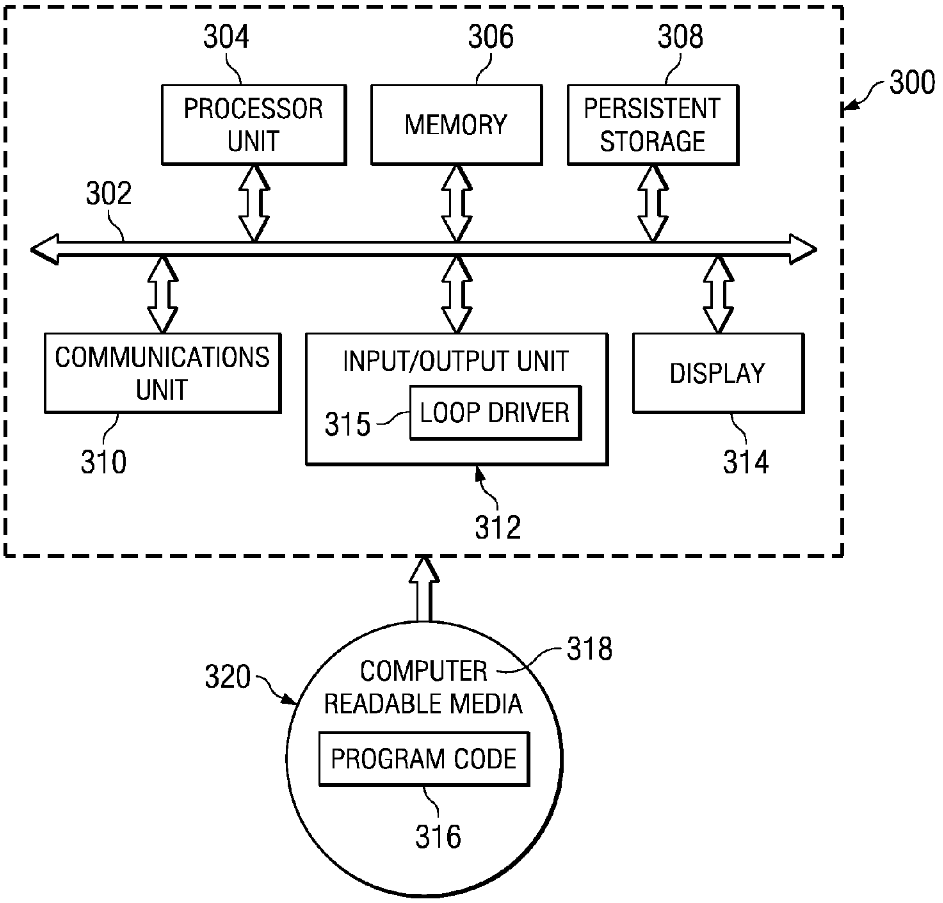
FIG. 3 is a diagram of a data processing system in accordance with an advantageous embodiment.

Turning now to FIG. 3, a diagram of a data processing system is depicted in accordance with an advantageous embodiment. In this example, data processing system 300 is an example of a device that may be used to implement central processor unit 202 in FIG. 2. In this illustrative example, data processing system 300 includes communications fabric 302, which provides communications between processor unit 304, memory 306, persistent storage 308, communications unit 310, input/output (I/O) unit 312, and display 314.

Processor unit 304 serves to execute instructions for software that may be loaded into memory 306. Processor unit 304 may be a set of one or more processors or may be a multi-processor core, depending on the particular implementation. Further, processor unit 304 may be implemented using one or more heterogeneous processor systems in which a main processor is present with secondary processors on a single chip. As another illustrative example, processor unit 304 may be a symmetric multi-processor system containing multiple processors of the same type.

Memory 306 and persistent storage 308 are examples of storage devices. A storage device is any piece of hardware that is capable of storing information either on a temporary basis and/or a permanent basis. Memory 306, in these examples, may be, for example, a random access memory or any other suitable volatile or non-volatile storage device.

Persistent storage 308 may take various forms depending on the particular implementation. For example, persistent storage 308 may contain one or more components or devices. For example, persistent storage 308 may be a hard drive, a flash memory, a rewritable optical disk, a rewritable magnetic tape, or some combination of the above. The media used by persistent storage 308 also may be removable. For example, a removable hard drive may be used for persistent storage 308.

Communications unit 310, in these examples, provides for communications with other data processing systems or devices. In these examples, communications unit 310 is a network interface card. Communications unit 310 may provide communications through the use of either or both physical and wireless communications links.

Input/output unit 312 allows for input and output of data with other devices that may be connected to data processing system 300. For example, input/output unit 312 may provide a connection for user input through a keyboard and mouse. Further, input/output unit 312 may send output to a printer. As yet another example, input/output unit 312 may include loop driver 315. Loop driver 315 provides power and communications to sensors within a sensor network in these examples. Display 314 provides a mechanism to display information to a user.

Instructions for the operating system and applications or programs are located on persistent storage 308. These instructions may be loaded into memory 306 for execution by processor unit 304. The processes of the different embodiments may be performed by processor unit 304 using computer implemented instructions, which may be located in a memory, such as memory 306. These instructions are referred to as program code, computer usable program code, or computer readable program code that may be read and executed by a processor in processor unit 304. The program code in the different embodiments may be embodied on different physical or tangible computer readable media, such as memory 306 or persistent storage 308.

Program code 316 is located in a functional form on computer readable media 318 that is selectively removable and may be loaded onto or transferred to data processing system 300 for execution by processor unit 304. Program code 316 and computer readable media 318 form computer program product 320 in these examples.

In one example, computer readable media 318 may be in a tangible form, such as, for example, an optical or magnetic disc that is inserted or placed into a drive or other device that is part of persistent storage 308 for transfer onto a storage device, such as a hard drive that is part of persistent storage 308.

In a tangible form, computer readable media 318 also may take the form of a persistent storage, such as a hard drive, a thumb drive, or a flash memory that is connected to data processing system 300. The tangible form of computer readable media 318 is also referred to as computer recordable storage media. In some instances, computer readable media 318 may not be removable.

Alternatively, program code 316 may be transferred to data processing system 300 from computer readable media 318 through a communications link to communications unit 310 and/or through a connection to input/output unit 312. The communications link and/or the connection may be physical or wireless in the illustrative examples.

The different components illustrated for data processing system 300 are not meant to provide architectural limitations to the manner in which different embodiments may be implemented. The different illustrative embodiments may be implemented in a data processing system including components in addition to or in place of those illustrated for data processing system 300. Other components shown in FIG. 3 can be varied from the illustrative examples shown.

Figure 4:
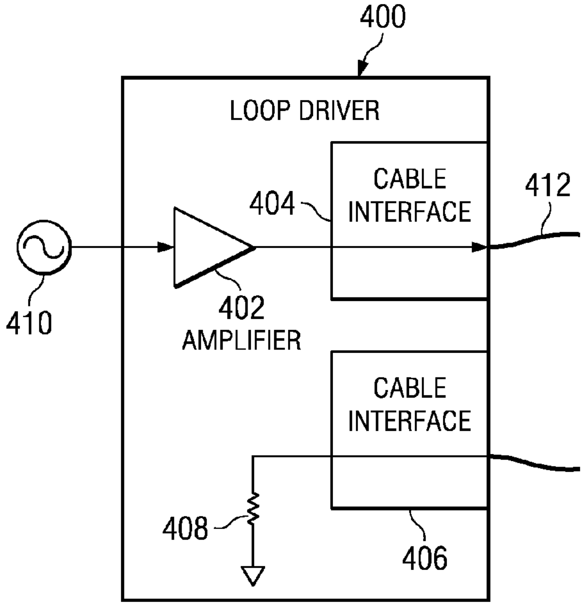
FIG. 4 is a diagram illustrating a loop driver in accordance with an advantageous embodiment.

With reference now to FIG. 4, a diagram illustrating a loop driver is depicted in accordance with an advantageous embodiment. In this example, loop driver 400 is an example of a loop driver, such as loop driver 315 that may be implemented in data processing system 300 in FIG. 3.

In this example, loop driver 400 includes amplifier 402, cable interface 404, cable interface 406, resistor 408, and alternating current source 410. Alternating current source 410 generates a current that may be amplified by amplifier 402 and sent on to cable 412 through cable interface 404. Cable interface 406 also is connected to cable 412, in these examples, and resistor 408 may generate a voltage. This voltage, across resistor 408, may change as the demand for current on cable 412 changes.

In this example, alternating current source 410 generates currents with a cycle of a sine wave. Loop driver 400 may use the cycles of the sine wave generated by alternating current source 410 to communicate or send information to the different nodes attached to cable 412. The sine wave may encode data in a number of different ways.

For examples, if the period of the sine wave waveform starts by increasing, a logic 1 may be present. If the waveform decreases at the beginning of the next period, a logic 0 may be present. The determination may be made after a set number of wavelengths and/or periods of the sine wave have occurred.

This information may be, for example, data and/or commands. Further, this information may be broadcast to all nodes and the different nodes may distinguish which node should receive information based on a logical address that may be included in the message stream. The data rate that may be generated by loop driver 400 may be, for example, without limitation, 4800 bits per second.

Figure 5:
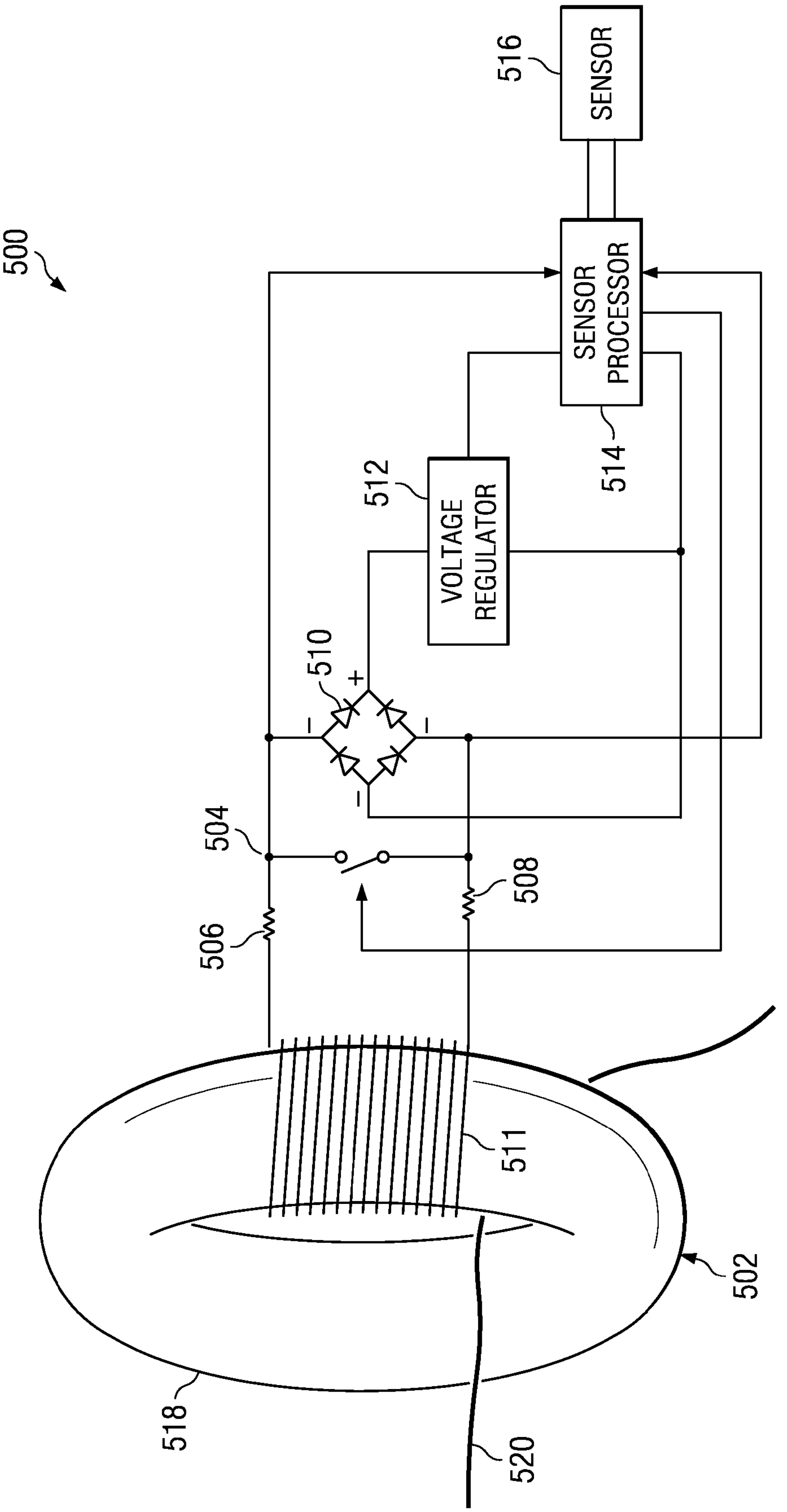
FIG. 5 is a schematic block diagram of a sensor unit in accordance with an advantageous embodiment.

With reference now to FIG. 5, a schematic block diagram of a sensor unit is depicted in accordance with an advantageous embodiment. In this example, sensor unit 500 includes inductive coupler 502, switch 504, resistor 506, resistor 508, full wave rectifier 510, voltage regulator 512, sensor processor 514, and sensor 516. Resistor 506, switch 504, resistor 508, full wave rectifier 510, voltage regulator 512, and sensor processor 514 may form a node similar to node 218 in FIG. 2.

In this example, inductive coupler 502 uses a split core architecture. This split core architecture includes ring 518 and coils 511. Ring 518 may be opened to provide a capability to clamp inductive coupler 502 to cable 520. The configuration of materials used for inductive coupler 502 with a split core architecture may be implemented using any currently available design for an inductive coupler using split core layouts or architectures.

Of course, other types of transformers may be used depending on the particular implementation. For example, a clamp on transformer and a flexible transformer also may be used. With a flexible transformer, cable 520 may be passed through the loop formed by the flexible transformer. In this type of implementation, opening and closing the loop is unnecessary.

Full wave rectifier 510 changes the alternating current received through coil 511 into a direct current used by sensor processor 514. Rectifier 510 provides a direct current to sensor processor 514. Voltage regulator 512 maintains the voltage generated by full wave rectifier 510.

Sensor processor 514 may be, for example, a microprocessor, an application specific integrated circuit, or some other suitable device. Sensor processor 514 receives data from sensor 516 and may store that data within memory locator within sensor processor 514.

This data may be transmitted to the central processor unit by manipulating the state of switch 504 in these examples. For example, switch 504 is in a closed state, and sensor unit 500 is in a shorted state. This shorted state increases the current demand and is identified by the central processor unit as a logic 0. When switch 504 is open, the demand for current on cable 520 is reduced, and this change is read as a logic 1. In this manner, sensor unit 500 may generate and send data to the central processor unit.

Further, sensor processor 514 may detect changes in the current level in cable 520 through inductive coupler 502. These changes may be identified as logic bits. Sensor processor 514 may detect changes in the amplitude and/or phase of the sine wave to detect data. Sensor processor 514 may determine whether the information is for sensor unit 500 based on some logical identifier that may be associated with sensor unit 500.

In these examples, a data rate of 4800 bits per second is used. This data rate is one that may be demodulated by sensor processor 514 without the need for additional circuits. When other data rates are used, additional circuits may be included to aid in the processing of high data rates.

Figure 6:
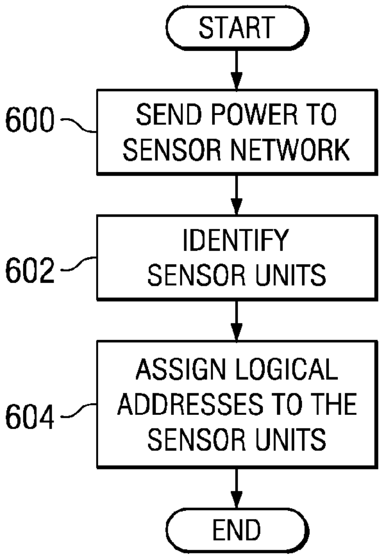
FIG. 6 is a flowchart of a process for powering up a sensor network in accordance with an advantageous embodiment.

With reference now to FIG. 6, a flowchart of a process for powering up a sensor network is depicted in accordance with an advantageous embodiment. The process illustrated in FIG. 6 may be implemented in a central processor unit, such as central processor unit 202 in FIG. 2.

The process begins by sending power to the sensor network (operation 600). This power may be sent through a loop driver, such as loop driver 400 in FIG. 4.

The process identifies sensor units on the sensor network (operation 602). This identification may be made in a number of different ways. The central process may broadcast information to all of the sensor units and identify the presence of different sensor units based on the responses. For example, the central processor unit may broadcast a message to all of the sensor units to request each sensor unit to send back a logical identifier or logical address.

In other advantageous embodiments, the central processor unit may send out a series of bits for serial numbers that may be used to apply to different sensor units. Based on which sensor units respond as having the particular sequence or a higher sequence, the central processor unit may systematically identify the number of different sensor nodes that may be present. Further, based on responses, the central processor unit may identify serial numbers for each of these sensor units.

The process then may assign logical addresses to the identified sensor units (operation 604), with the process terminating thereafter. This assignment may be made by sending back information to each sensor unit. For example, the central processor unit may send back a serial number identified for a sensor unit along with a logical address and a command indicating that this logical address has been assigned to that sensor unit.

This type of discovery is only one illustrative example and not meant to limit the use of other types of discovery that may be used or the manner in which other identifiers may be assigned to sensor units.

Figure 7:
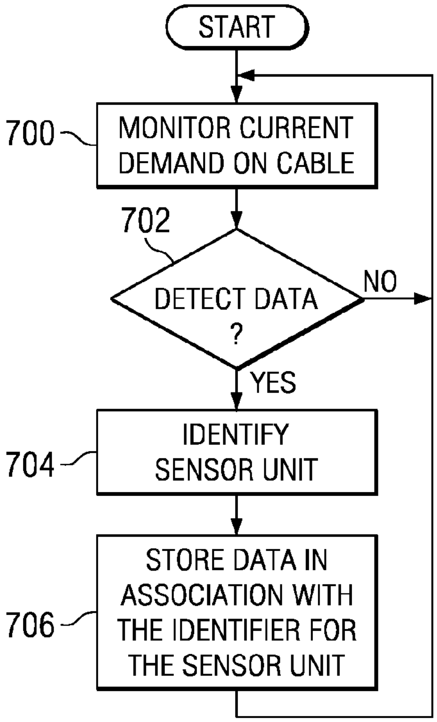
FIG. 7 is a flowchart of a process for receiving data from sensor units in accordance with an advantageous embodiment.

With reference now to FIG. 7, a flowchart of a process for receiving data from sensor units is depicted in accordance with an advantageous embodiment. The process illustrated in FIG. 7 may be implemented in a central processor unit, such as central processor unit 202 in FIG. 2.

The process begins by monitoring the current demand on the cable (operation 700). Fluctuations in the cable demand may be used to identify when information is being received by the central processor unit. A determination is made as to whether data has been detected (operation 702). If data has not been detected, the process returns to operation 700.

Otherwise, the process identifies the sensor unit based on the received data (operation 704). In these examples, each message sent by a sensor unit includes an identifier for that sensor unit. In these examples, the identifier takes the form of a logical address. Of course, other identifiers may be used in other embodiments. The process then stores the data in association with the identifier for the sensor unit (operation 706), with the process then returning to operation 700.

Figure 8:
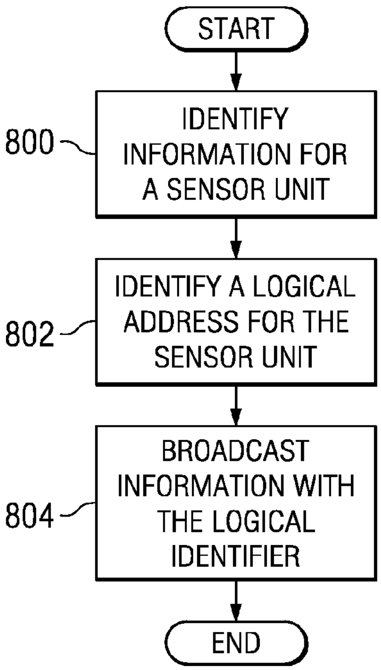
FIG. 8 is a flowchart of a process for transmitting information to a sensor unit in accordance with an advantageous embodiment.

With reference now to FIG. 8, a flowchart of a process for transmitting information to a sensor unit is depicted in accordance with an advantageous embodiment. The process illustrated in FIG. 8 may be implemented in a central processor unit, such as central processor unit 202 in FIG. 2.

In this example, the process begins by identifying information for a sensor unit (operation 800). This information may be, for example, data and/or commands. For example, a command may be sent to the sensor unit to retrieve data. In other advantageous embodiments, the command may be to instruct the sensor unit to send back data at some predetermined interval. In other advantageous embodiments, the command may be to shut down or wake up a sensor unit. The data may include, for example, a parameter, such as how often data should be returned or what type of data should be returned from a particular sensor unit.

The process identifies a logical address for the sensor unit (operation 802). The logical address may be one assigned by the central processor unit to the different sensor units. This logical address may be stored in a cable or other data structure for use in sending messages to the sensor units. Next, the process broadcasts the information with the logical identifier (operation 804), with the process terminating thereafter.

Figure 9:
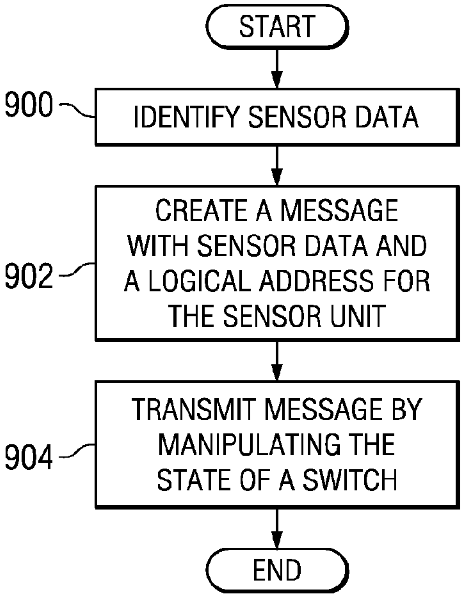
FIG. 9 is a flowchart of a process for sending data to a central processor unit in accordance with an advantageous embodiment.

With reference now to FIG. 9, a flowchart of a process for sending data to a central processor unit is depicted in accordance with an advantageous embodiment. The process illustrated in FIG. 9 may be implemented in a sensor unit, such as sensor unit 500 in FIG. 5. More specifically, the process may be implemented in sensor processor 514 in FIG. 5.

The process begins by identifying sensor data (operation 900). This sensor data may be identified when data is received from the sensor. In other advantageous embodiments, the sensor data may be stored in memory locally for transmission. After the sensor data is identified, the process creates a message with the sensor data and a logical address for the sensor unit (operation 902). The process then transmits the message by manipulating the state of a switch in the sensor unit (operation 904), with the process terminating thereafter. In these examples, the state of the switch is manipulated to generate logical zeros and ones to send the data to the cable.

The flowcharts and block diagrams in the different depicted embodiments illustrate the architecture, functionality, and operation of some possible implementations of apparatus, methods and computer program products. In this regard, each block in the flowcharts or block diagrams may represent a module, segment, or portion of computer usable or readable program code, which comprises one or more executable instructions for implementing the specified function or functions.

In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

Thus, the different advantageous embodiments provide a method and apparatus for collecting data from a sensor network. Further, the different advantageous embodiments also may be implemented as a computer implemented method and/or a computer program product in which program code contains instructions to perform the different operations described above.

In the different advantageous embodiments, the sensor network may include a set of cables capable of conducting electrical current. A set of sensor units is coupled to the set of cables without physical contact to a wire that may be in the set of cables. The set of sensors is capable of being powered by electrical current and is capable of transmitting data in the electrical current. The central processor unit is connected to the set of cables and is capable of receiving data from the set of sensor units in the electrical current.

In these different advantageous embodiments, the amount of wiring needed for a sensor network is reduced because only a single wire is needed for multiple sensor units. In some cases, multiple cables may be employed with each cable having multiple sensor units. The amount of cables is reduced, as compared to currently used systems in which two cables are used, one for power and one for data.

Further, the different advantageous embodiments also provide an ability to change the location or configuration of the sensor units without having to use new cable lengths or cut new cables for different locations. Of course, these different features and capabilities are examples of some of the features and capabilities that may be provided by one or more of the different advantageous embodiments.

The different advantageous embodiments can take the form of an entirely hardware embodiment, an entirely software embodiment, or an embodiment containing both hardware and software elements. Some embodiments are implemented in software, which includes but is not limited to forms, such as, for example, firmware, resident software, and microcode.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A sensor network comprising:

a set of cables capable of conducting an electrical current;

a set of sensor units coupled to the set of cables without physical contact to a wire located within the set of cables, wherein the set of sensor units comprises an inductive coupler capable of being fastened to a cable in the set of cables, and wherein the set of sensor units is capable of being powered by the electrical current and transmitting data in the electrical current;

a sensor processor connected to the inductive coupler;

a rectifier connecting the inductive coupler to the signal processor; and a central processor unit connected to the set of cables wherein the central processor unit is capable of receiving the data from the set of sensor units in the electrical current.

2. The sensor network of claim 1, wherein a sensor unit in the set of sensor units comprises:

a sensor connected to the sensor processor.

3. The sensor network of claim 2, wherein the inductive coupler is a split core transformer.

4. The sensor network of claim 2, wherein the sensor is selected from one of a thermometer, a thermistor, an ohm meter, an ammeter, a voltmeter, a hall effect device, an altimeter, a pressure sensor, a gas flow sensor, an oxygen sensor, a carbon monoxide sensor, a photocell, an infrared sensor, a microphone, a hydrophone, and a motion sensor.

5. The sensor network of claim 2, wherein the sensor unit further comprises:

a switch connected to the inductive coupler and the sensor processor.

6. The sensor network of claim 5, wherein the sensor processor controls a state of the switch to transmit the data to the central processor unit.

7. The sensor network of claim 5, wherein a logic 1 is generated when the switch is closed and a logic 0 is generated when the switch is open.

8. The sensor network of claim 1, wherein a sensor unit in the set of sensor units comprises:

a sensor connected to the sensor processor; and a switch connected to the inductive coupler and the sensor processor, wherein the sensor processor controls a state of the switch to transmit the data to the central processor unit.

9. The sensor network of claim 1, wherein the central processor unit comprises:

a loop driver capable of sending the current through the set of cables and receiving data through the set of cables.

10. The sensor network of claim 9, wherein the loop driver comprises:

an amplifier capable of sending the electrical current through the set of cables; and a resistor having a voltage reflecting changes in the electrical current caused by a receipt of the data by the loop driver.

11. The sensor network of claim 1, wherein the electrical current is an alternating current.

12. An apparatus comprising:

a set of cables capable of conducting an electrical current; and a set of sensor units coupled to the set of cables without physical contact to a wire in the set of cables, wherein the set of sensor units comprises an inductive coupler capable of being fastened to a cable in the set of cables, and wherein the set of sensor units is capable of being powered by the electrical current and transmitting data in the electrical current;

a sensor processor connected to the inductive coupler; and a rectifier connecting the inductive coupler to the signal processor.

13. The apparatus of claim 12 further comprising:

a central processor unit connected to the set of cables capable of receiving the data from the set of sensor units in the electrical current.

14. The apparatus of claim 12, wherein a sensor unit in the set of sensor units comprises:

a sensor connected to the sensor processor.

15. The apparatus of claim 12 further comprising:

a device under test, wherein the set of sensor units is in locations relative to the device under test such that the set of sensor units is capable of detecting a set of physical quantities about the device under test.

16. The apparatus of claim 12 further comprising:

a test chamber.

17. A method for managing a plurality of inductively coupled sensor units, the method comprising:

receiving data on a cable from a plurality of sensor units that is inductively coupled to the cable by an inductive coupler capable of being fastened to a cable in the set of cables, the inductive coupler being connected to a sensor processor and a rectifier connecting the inductive coupler to the signal processor, and wherein the plurality of sensor units is powered by current in the cable; and storing the data in a storage device.

18. The method of claim 17 further comprising:

attaching the plurality of sensor units to a plurality of locations along the cable; and sending the current through the cable to power the plurality of sensor units.

19. The method of claim 17 further comprising:

sending information to the plurality of sensor units through the cable.

20. The method of claim 17, wherein a sensor unit in the plurality of sensor units comprises:

a sensor connected to the sensor processor.

21. The method of claim 17, wherein the receiving step comprises:

detecting changes in the current demand to receive the data from the plurality of sensor units.

* * * * *